(12) United States Patent
Cheng

(10) Patent No.: US 10,483,497 B2
(45) Date of Patent: Nov. 19, 2019

(54) OLED SUBSTRATE AND MANUFACTURING METHOD THEREOF AND DISPLAY DEVICE

(71) Applicants: BOE Technology Group Co., Ltd., Beijing (CN); Hefei Xinsheng Optoelectronics Technology Co., Ltd., Hefei (CN)

(72) Inventor: Leilei Cheng, Beijing (CN)

(73) Assignees: BOE Technology Group Co., Ltd., Beijing (CN); Hefei Xinsheng Optoelectronics Technology Co., Ltd., Hefei (CN)

(*) Notice: Subject to any disclaimer, the term of this patent is extended or adjusted under 35 U.S.C. 154(b) by 0 days.

(21) Appl. No.: 15/981,324

(22) Filed: May 16, 2018

(65) Prior Publication Data

US 2019/0097165 A1 Mar. 28, 2019

(30) Foreign Application Priority Data

Sep. 25, 2017 (CN) .......................... 2017 1 0874909

(51) Int. Cl.
*H01L 51/52* (2006.01)
*H01L 51/56* (2006.01)
*H01L 27/32* (2006.01)

(52) U.S. Cl.
CPC ........ *H01L 51/529* (2013.01); *H01L 27/3272* (2013.01); *H01L 51/56* (2013.01); *H01L 27/322* (2013.01); *H01L 27/3244* (2013.01)

(58) Field of Classification Search
None
See application file for complete search history.

(56) References Cited

U.S. PATENT DOCUMENTS

| 2004/0090178 | A1* | 5/2004 | Chuang | ............... H01L 27/3246 |
| | | | | 313/506 |
| 2015/0132864 | A1* | 5/2015 | Suzuki | ............... H01L 51/5206 |
| | | | | 438/7 |
| 2016/0254485 | A1* | 9/2016 | Song | ...................... H01L 51/56 |
| | | | | 257/40 |

FOREIGN PATENT DOCUMENTS

CN 106206456 A 12/2016

* cited by examiner

*Primary Examiner* — J. E. Schoenholtz
(74) *Attorney, Agent, or Firm* — Banner & Witcoff, Ltd.

(57) ABSTRACT

Embodiments of the present disclosure provide an OLED substrate and a manufacturing method thereof and a display device. The OLED substrate includes: a base substrate; a first electrode and a second electrode which are on the base substrate; an organic material functional layer between the first electrode and the second electrode; and an auxiliary heat dissipation layer which is at a light exit side of the organic material functional layer and is in contact with the organic material functional layer. The auxiliary heat dissipation layer includes a metal heat dissipation portion and a metal oxide light transmission portion.

18 Claims, 5 Drawing Sheets

OLED SUBSTRATE AND MANUFACTURING METHOD THEREOF AND DISPLAY DEVICE

This application claims priority to and the benefit of Chinese Patent Application No. 201710874909.3 filed on Sep. 25, 2017, which application is incorporated herein in its entirety.

TECHNICAL FIELD

Embodiments of the present disclosure relates to an OLED substrate, a manufacturing method of the OLED substrate and a display device.

BACKGROUND

With the development of self-luminous display technology, an organic light-emitting diode (OLED) display gradually replaces a traditional liquid crystal display (LCD) due to its advantages of low power consumption, low cost, wide viewing angle, high response speed and so on. The main structure of the OLED display includes an array substrate which includes a cathode layer, an anode layer and an organic light-emitting layer sandwiched between the cathode layer and the anode layer. The material of the organic light-emitting layer is expensive, and its service life is directly related to the manufacturing cost and the use range of the OLED display.

At present, the color implementation methods of the OLED display mainly include two types. A first type is to use organic light-emitting materials that directly emit light of different colors and use thin film transistors (TFTs) included in the array substrate to control the light-emitting states of the sub-pixels of the OLED display to achieve the display of different colors. A second type is to use white OLEDs to cooperate with a color filter layer so as to achieve the display of different colors. The former is not widely used because of the less maturity of technology and the high price of organic light-emitting materials of different colors. The method of using the white OLEDs to cooperate with the color filter layer takes into account the process cost of the organic light-emitting layer, the optimization of the electrical properties of the thin film transistors (TFTs) in the array substrate by a light-shielding layer and the improvement of the color display quality, and thus has become the main research direction of the current OLED flat panel display.

The service life of the organic light-emitting layer directly affects the service life and the display effect of the OLED display. In a situation where the heat released by the organic light-emitting layer during its working process is not dissipated in time, the service life of the organic light-emitting layer is reduced, and thus the service life and the display effect of the OLED display are affected.

SUMMARY

According to an embodiment of the present disclosure, an OLED (organic light-emitting diode) substrate is provided and includes: a base substrate; a first electrode and a second electrode which are on the base substrate; an organic material functional layer between the first electrode and the second electrode; and an auxiliary heat dissipation layer which is at a light exit side of the organic material functional layer and is in contact with the organic material functional layer. The auxiliary heat dissipation layer includes a metal heat dissipation portion and a metal oxide light transmission portion.

For example, the metal heat dissipation portion includes a metal, the metal oxide light transmission portion includes a metal oxide, and the metal oxide is an oxide of the metal.

For example, the metal includes an elemental metal.

For example, the metal includes tantalum and the metal oxide includes tantalum oxide.

For example, the OLED substrate further includes a plurality of sub-pixels arranged in an array manner on the base substrate, each of the sub-pixels includes a scan line, a data line, a power source line and a thin film transistor, a gate electrode of the thin film transistor is connected with the scan line, a source electrode of the thin film transistor is connected with the data line, and a drain electrode of the thin film transistor is connected with the power source line and is connected with the first electrode or the second electrode. An orthographic projection of the metal heat dissipation portion on the base substrate covers an orthographic projection of the thin film transistor on the base substrate; and the orthographic projection of the metal heat dissipation portion on the base substrate further covers orthographic projections of the scan line, the data line and the power source line on the base substrate.

For example, each of the sub-pixels includes a light exit region, and an orthographic projection of the metal oxide light transmission portion on the base substrate coincides with an orthographic projection of the light exit region on the base substrate.

For example, on the base substrate, an upper surface of the metal heat dissipation portion and an upper surface of the metal oxide light transmission portion are in a same plane, and a lower surface of the metal heat dissipation portion and a lower surface of the metal oxide light transmission portion are in a same plane.

For example, the OLED substrate further includes a color filter layer at a side of the auxiliary heat dissipation layer facing away from the organic material functional layer.

According to an embodiment of the present disclosure, a manufacturing method of an OLED substrate is provided and includes: forming a first electrode and a second electrode on a base substrate; forming an organic material functional layer between the first electrode and the second electrode; and forming an auxiliary heat dissipation layer which is at a light exit side of the organic material functional layer and is in contact with the organic material functional layer. The auxiliary heat dissipation layer includes a metal heat dissipation portion and a metal oxide light transmission portion.

For example, forming the auxiliary heat dissipation layer includes: forming a metal film and performing an oxidation treatment on a first portion of the metal film to form the metal oxide light transmission portion, in which step, a second portion, which is not subjected to the oxidation treatment, of the metal film forms the metal heat dissipation portion.

For example, the oxidation treatment is performed using hydrogen peroxide.

For example, the metal film is formed of an elemental metal.

For example, the metal film is formed of tantalum.

For example, the OLED substrate includes a plurality of sub-pixels arranged in an array manner on the base substrate, each of the sub-pixels includes a scan line, a data line, a power source line and a thin film transistor, a gate electrode of the thin film transistor is connected with the scan line, a source electrode of the thin film transistor is connected with the data line, and a drain electrode of the thin film transistor is connected with the power source line and is connected with the first electrode or the second electrode; an orthographic projection of the metal heat dissipation portion on the base substrate covers an orthographic projection of the thin film transistor on the base substrate; and the orthographic projection of the metal heat dissipation portion on the base substrate further covers orthographic projections of the scan line, the data line and the power source line on the base substrate.

For example, each of the sub-pixels includes a light exit region, and an orthographic projection of the metal oxide light transmission portion on the base substrate coincides with an orthographic projection of the light exit region on the base substrate.

For example, on the base substrate, an upper surface of the metal heat dissipation portion and an upper surface of the metal oxide light transmission portion are in a same plane, and a lower surface of the metal heat dissipation portion and a lower surface of the metal oxide light transmission portion are in a same plane.

For example, the manufacturing method further includes: forming a color filter layer at a side of the auxiliary heat dissipation layer facing away from the organic material functional layer.

According to an embodiment of the present disclosure, a display device including the above OLED substrate is provided.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

Figure 1:
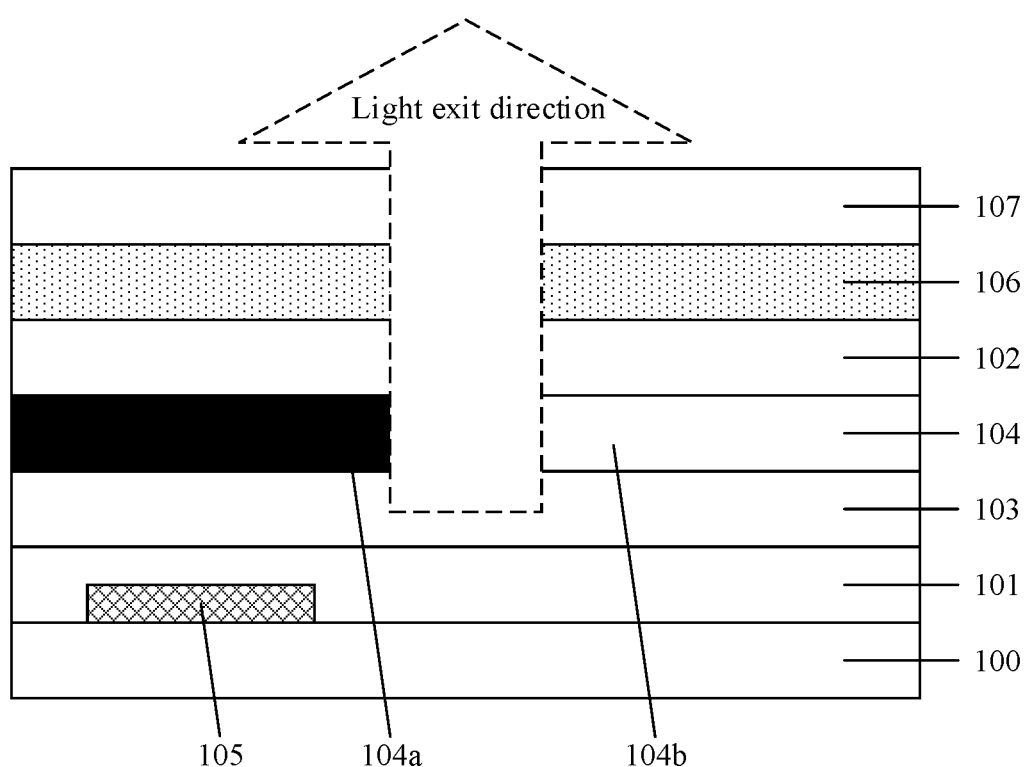
FIG. 1 schematically shows a first schematic structural view of an OLED substrate according to at least one embodiment of the present disclosure.

Reference numerals: 100—base substrate; 101—first electrode; 102—second electrode; 103—organic material functional layer; 104—auxiliary heat dissipation layer; 104a—metal heat dissipation portion; 104b—metal oxide light transmission portion; 1040—metal film; 1041—photoresist; 1042—photoresist-removing portion; 1043—photoresist-retaining portion; 105—thin film transistor; 106—color filter layer; 107—protection layer.

DETAILED DESCRIPTION order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The drawings are merely schematic and are not necessarily drawn according to a scale. The thickness and shape of each layer in the drawings do not reflect a true scale, and are only for the convenience of describing the contents of the present disclosure. The same reference numerals in the drawings denote the same or similar parts, and their repeated description will be omitted.

Figure 7:
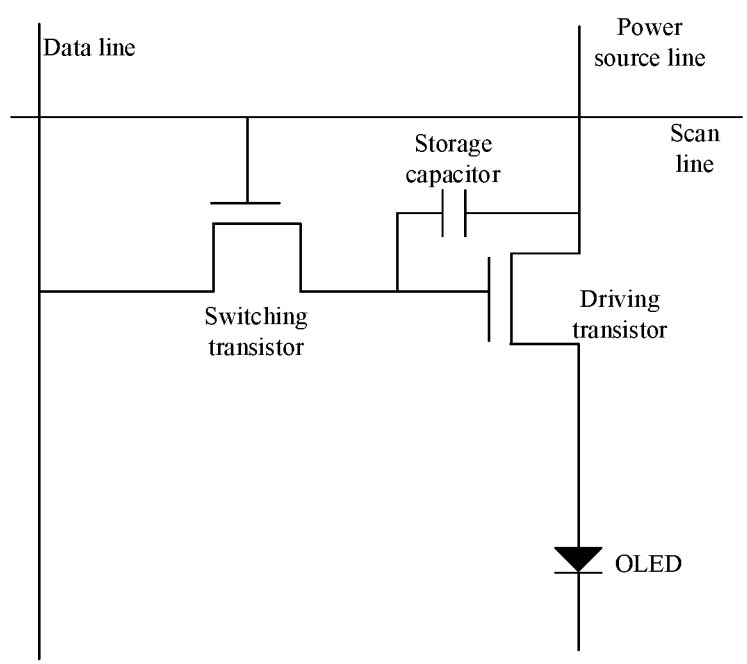
FIG. 7 schematically shows a circuit diagram of the OLED substrate according to at least one embodiment of the present disclosure.

The embodiments of the present disclosure provide an OLED (organic light-emitting diode) substrate. For example, the OLED substrate includes a plurality of sub-pixels arranged in an array manner. Each sub-pixel includes a scan line, a data line, a power source line and a thin film transistor. A gate electrode of the thin film transistor is connected with the scan line, a source electrode of the thin film transistor is connected with the data line, and a drain electrode of the thin film transistor is connected with the power source line and is connected with a first electrode or a second electrode of an OLED in the sub-pixel. Referring to FIG. 7, only one sub-pixel is shown as an example, and the other sub-pixels are substantially the same as the sub-pixel shown in FIG. 7. Referring to FIG. 7, the thin film transistor includes a driving transistor and a switching transistor. Each sub-pixel further includes a storage capacitor and the OLED. A gate electrode of the switching transistor is connected with the scan line, a source electrode of the switching transistor is connected with the data line, and a drain electrode of the switching transistor is connected with a gate electrode of the driving transistor. A source electrode of the driving transistor is connected with the power source line, a drain electrode of the driving transistor is connected with the first electrode or the second electrode of the OLED. A first end of the storage capacitor is connected with the drain electrode of the switching transistor, and a second end of the storage capacitor is connected with the power source line and the source electrode of the driving transistor. It should be noted that the OLED substrate according to the embodiments of the present disclosure is not limited to the example shown in FIG. 7.

Figure 2:
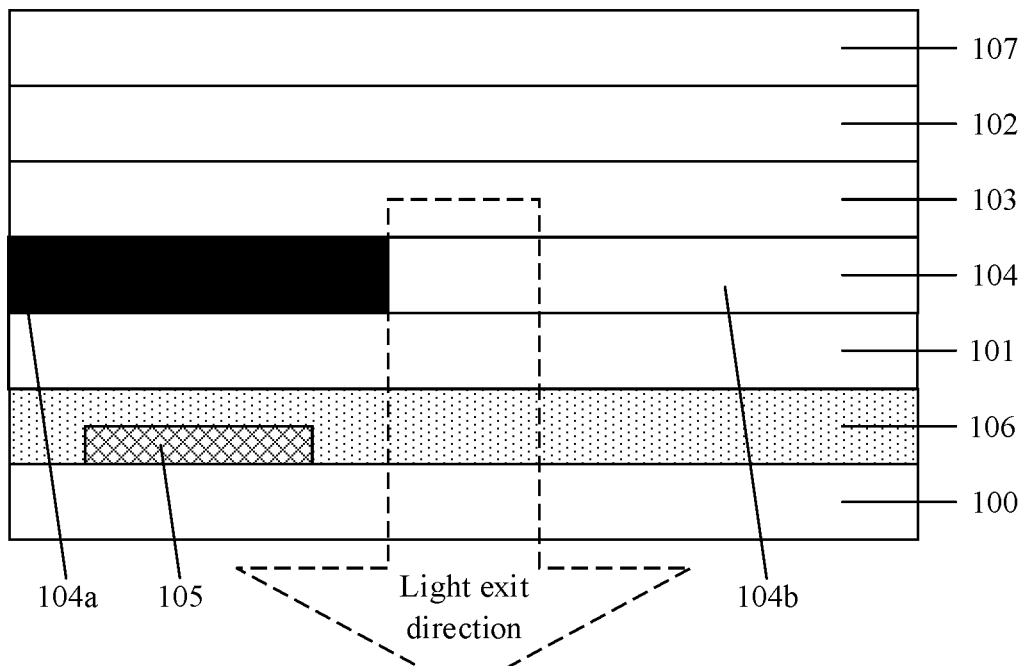
FIG. 2 schematically shows a second schematic structural view of the OLED substrate according to at least one embodiment of the present disclosure.

For example, as shown in FIG. 1 and FIG. 2, the OLED substrate includes: a base substrate 100; a first electrode 101 and a second electrode 102 which are on the base substrate 100; an organic material functional layer 103 between the first electrode 101 and the second electrode 102; and an auxiliary heat dissipation layer 104 which is at a light exit side of the organic material functional layer 103, is in contact with the organic material functional layer 103 and includes a metal heat dissipation portion 104a and a metal oxide light transmission portion 104b.

For example, the metal oxide light transmission portion 104b corresponds to a light exit region of each sub-pixel, and the metal heat dissipation portion 104a is in a region, outside the light exit region, of each sub-pixel. For example, an orthographic projection of the metal oxide light transmission portion 104b on the base substrate 100 coincides with an orthographic projection of the light exit region on the base substrate 100. For example, the metal heat dissipation portion 104a is light-proof.

For example, the light exit side of the organic material functional layer 103 refers to a side of the organic material functional layer 103 on which a transparent electrode is disposed. In a situation where the first electrode 101 is the transparent electrode, the light exit side is a side on which the first electrode 101 is located; and in a situation where the second electrode 102 is the transparent electrode, the light exit side is a side on which the second electrode 102 is located.

For example, the organic material functional layer 103 is further in contact with the transparent electrode which is the first electrode 101 or the second electrode 102. In the situation where the first electrode 101 is the transparent electrode, the organic material functional layer 103 is in contact with the first electrode 101; and in the situation where the second electrode 102 is the transparent electrode, the organic material functional layer 103 is in contact with the second electrode 102.

In the OLED substrate provided by the embodiments of the present disclosure, by providing the auxiliary heat dissipation layer 104 which is at the light exit side of the organic material functional layer 103 and in contact with the organic material functional layer 103, the organic material functional layer 103 is protected on one hand; and on the other hand, the high thermal conductivity characteristic of the metal promotes the dissipation of heat from the organic material functional layer 103, and thus the service life and display effect of an OLED device are improved.

In at least one embodiment of the present disclosure, a metal oxide in the metal oxide light transmission portion 104b is obtained by oxidizing a metal in the metal heat dissipation portion 104a. In other words, the metal heat dissipation portion 104a includes the metal, the metal oxide light transmission portion 104b includes the metal oxide, and the metal oxide is an oxide of the metal. For example, oxidation of the metal is performed by using, for example, hydrogen peroxide. For example, the metal heat dissipation portion 104a includes an elemental metal because the heat-dissipation performance of the elemental metal is good. For example, the metal heat dissipation portion 104a includes only the elemental metal and does not include a metal compound such as a metal oxide to further ensure the heat-dissipation performance of the heat dissipation portion 104a. For example, the metal oxide light transmission portion 104b includes only the metal oxide and does not include an elemental metal to ensure the light transmission property of the light transmission portion 104b.

In this way, because the metal has a good heat-dissipation performance, it helps to achieve rapid heat dissipation of the organic material functional layer 103, and the metal oxide has a good light transmission performance so as not to affect the light emission of the organic material functional layer 103.

The metal includes, for example, tantalum; and the metal oxide correspondingly includes, for example, tantalum oxide. The embodiments of the present disclosure do not specifically limit the types of the metal and the metal oxide.

In at least one embodiment of the present disclosure, the OLED substrate further includes a thin film transistor 105 on the base substrate 100. The thin film transistor 105 is, for example, the driving transistor or the switching transistor as described above or a combination of the driving transistor and the switching transistor, and the embodiments of the present disclosure are not limited thereto. For example, the drain electrode of the driving transistor is electrically connected with the first electrode 101 so as to provide the first electrode 101 with an electrical signal.

Considering that the electrical properties of the thin film transistor 105 are easily affected by light, in at least one embodiment of the present disclosure, a position of the metal heat dissipation portion 104a corresponds to a position of the thin film transistor 105. That is to say, the orthographic projection of the metal heat dissipation portion 104a on the base substrate 100 covers the orthographic projection of the thin film transistor 105 on the base substrate 100.

In this way, because the metal heat dissipation portion 104a is light-proof, the thin film transistor 105 is shielded by the metal heat dissipation portion 104a, so that the thin film transistor 105 is prevented from being affected by light, and the stability of the thin film transistor 105 is ensured.

In at least one embodiment of the present disclosure, for example, the base substrate 100 is a flexible substrate or a rigid substrate and is formed of a material having excellent mechanical strength or dimensional stability. A material of the flexible substrate is any one of, for example, polycarbonate resin, acrylic resin, vinyl chloride resin, polyethylene terephthalate resin, polyimide resin, polyester resin, epoxy resin, silicone resin, fluorine-containing resin and the like. For example, a material of the rigid substrate is any one of, for example, glass, metal, ceramic and the like.

In at least one embodiment of the present disclosure, the organic material functional layer 103 uses organic light-emitting materials capable of respectively directly emitting light of different colors (for example, light of red (R) color, light of green (G) color and light of blue (B) color) to realize display of different colors. Alternatively, the organic material functional layer 103 uses an organic light-emitting material emitting white light which cooperates with a color filter layer to realize the display of different colors. Embodiments of the present disclosure are not limited thereto.

In consideration of the cost and the technical process maturity of the organic light-emitting materials, the embodiments of the present disclosure preferably use the organic light-emitting material emitting white light. In this case, referring to FIG. 1 and FIG. 2, the OLED substrate further includes a color filter layer 106 disposed at a side of the auxiliary heat dissipation layer 104 facing away from the organic material functional layer 103.

Exemplarily, the color filter layer 106 is formed of red (R) color filters, green (G) color filters and blue (B) color filters which are periodically arranged, or is formed of red (R) color filters, green (G) color filters, blue (B) color filters and white (W) color filters which are periodically arranged. Embodiments of the present disclosure are not limited thereto.

The organic material functional layer 103 uses the organic light-emitting material that emits white light; compared with the case of using the organic light-emitting materials that emit light of different colors, the organic material functional layer 103 using the organic light-emitting material that emits white light has advantages of not only low cost but also more mature process technology.

In addition, a light-blocking layer needs to be arranged between adjacent sub-pixels to prevent the light emitted by adjacent sub-pixels from interfering with each other. The light-blocking layer is usually realized by a black matrix (BM) which is individually prepared, and the preparation process of the black matrix is relatively complicated. In at least one embodiment of the present disclosure, the position of the metal heat dissipation portion 104a corresponds to the positions between adjacent sub-pixels. For example, the position of the metal heat dissipation portion 104a corresponds to the positions of respective signal lines. That is to say, the orthographic projection of the metal heat dissipation portion 104a on the base substrate 100 covers the orthographic projections of the signal lines between the adjacent sub-pixels on the base substrate 100. In this way, it is possible to replace the light-blocking layer with the metal heat dissipation portion 104a, thereby simplifying the process, reducing the process cost and improving the production efficiency. For example, the signal lines between the adjacent sub-pixels include the scan line, the data line, and the power source line as described above. For example, the orthographic projection of the metal heat dissipation portion 104a on the base substrate 100 covers the orthographic projections of the scan line, the data line, and the power source line on the base substrate 100.

On the base substrate 100, an upper surface of the metal heat dissipation portion 104a and an upper surface of the metal oxide light transmission portion 104b are in a same plane, and a lower surface of the metal heat dissipation portion 104a and a lower surface of the metal oxide light transmission portion 104b are in a same plane. In this way, it is beneficial to obtain a flat OLED substrate, which facilitates the subsequent alignment process or sealing process.

For example, the OLED substrate further includes a protection layer 107 which is an outermost layer. A material of the protection layer 107 is at least one selected from the group consisting of, for example, aluminum oxide ($AlO_x$), silicon oxide ($SiO_x$), silicon nitride ($SiN_x$), silicon nitride oxide (SiON), hafnium oxide ($HfO_x$) or organic insulating material.

The structure of the OLED substrate will be described in detail with two specific examples in the following with reference to the drawings.

In a first example, the OLED substrate is used to form a top emission OLED display. Referring to FIG. 1, the OLED substrate includes: the base substrate 100; the thin film transistor 105 on the base substrate 100; the first electrode 101 which is on the thin film transistor 105 and is, for example, a metal electrode; the organic material functional layer 103 on the first electrode 101; the auxiliary heat dissipation layer 104 on the organic material functional layer 103; the second electrode 102 which is on the auxiliary heat dissipation layer 104 and is, for example, an ITO (indium tin oxide) electrode; the color filter layer 106 on the second electrode 102; and the protection layer 107 which is provided on the color filter layer 106 and is, for example, an aluminum oxide film.

The auxiliary heat dissipation layer 104 includes the metal heat dissipation portion 104a and the metal oxide light transmission portion 104b. The metal heat dissipation portion 104a corresponds to both the thin film transistor 105 and the position between adjacent sub-pixels (for example, the position of each signal line), and the metal oxide light transmission portion 104b corresponds to the light exit region of each sub-pixel.

In this way, the OLED substrate applied to the top emission OLED display is obtained. On one hand, in the OLED substrate, the heat dissipation of the organic material functional layer 103 is effectively promoted by providing the auxiliary heat dissipation layer 104, and thereby the service life and the display effect of the OLED display are improved; and on the other hand, the metal heat dissipation portion 104a in the auxiliary heat dissipation layer 104 replaces the conventional black matrix, and this effectively simplifies the process, thereby improves the production efficiency and reduces the production cost.

In a second example, the OLED substrate is used to form a bottom emission OLED display. Referring to FIG. 2, the OLED substrate includes: the base substrate 100, the thin film transistor 105 on the base substrate 100; the color filter layer 106 on the thin film transistor 105; the first electrode 101 which is on the color filter layer 106 and is, for example, the ITO electrode; the auxiliary heat dissipation layer 104 on the first electrode 101; the organic material functional layer 103 on the auxiliary heat dissipation layer 104; the second electrode 102 which is on the organic material functional layer 103 and is, for example, the metal electrode; and the protection layer 107 which is on the second electrode 102 and is, for example, a silicon oxide film.

The auxiliary heat dissipation layer 104 includes the metal heat dissipation portion 104a and the metal oxide light transmission portion 104b. The metal heat dissipation portion 104a corresponds to the thin film transistor 105 and the position between adjacent sub-pixels (for example, the position of each signal line) and the metal oxide light transmission portion 104b corresponds to the light exit region of each sub-pixel.

In this way, the OLED substrate applied to the bottom emission OLED display is obtained. On one hand, in the OLED substrate, the heat dissipation of the organic material functional layer 103 is effectively promoted by providing the auxiliary heat dissipation layer 104, and thereby the service life and the display effect of the OLED display are improved; and on the other hand, the metal heat dissipation portion 104a in the auxiliary heat dissipation layer 104 replaces the conventional black matrix, and this effectively simplifies the process, thereby improves the production efficiency and reduces the production cost.

Figure 3:
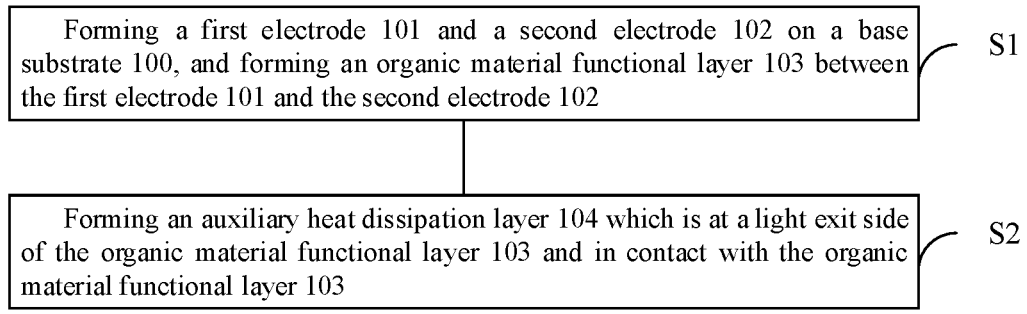
FIG. 3 schematically shows a schematic flow chart of a manufacturing method of the OLED substrate according to at least one embodiment of the present disclosure.

The embodiments of the present disclosure also provide a manufacturing method of an OLED substrate. As shown in FIG. 3, the manufacturing method includes the following steps S1-S2.

S1: forming a first electrode 101 and a second electrode 102 on the base substrate 100, and forming an organic material functional layer 103 between the first electrode 101 and the second electrode 102.

S2: forming an auxiliary heat dissipation layer 104 which is in contact with the organic material functional layer 103 at a light exit side of the organic material functional layer 103 and includes a metal heat dissipation portion 104a and a metal oxide light transmission portion 104b.

In the manufacturing method of the OLED substrate provided by the embodiments of the present disclosure, by providing the auxiliary heat dissipation layer 104 in contact with the organic material functional layer 103 at the light exit side of the organic material functional layer 103, the organic material functional layer 103 is protected. On the other hand, it is also possible to promote the dissipation of heat of the organic material functional layer 103 by utilizing the high thermal conductivity characteristic of metal, and thereby to improve the service life and the display effect of the OLED substrate.

In at least one embodiment of the present disclosure, forming the auxiliary heat dissipation layer 104 includes: first forming a metal film 1040, then performing an oxidation treatment on a first portion of the metal film 1040 to form the metal oxide light transmission portion 104b, in which step, a second portion, of the metal film 1040, which is not subjected to the oxidation treatment forms the metal heat dissipation portion 104a, thereby obtaining the auxiliary heat dissipation layer 104.

For example, hydrogen peroxide is used for the oxidation treatment. The embodiments of the present disclosure do not limit the specific manner of the oxidation treatment.

Figure 4:
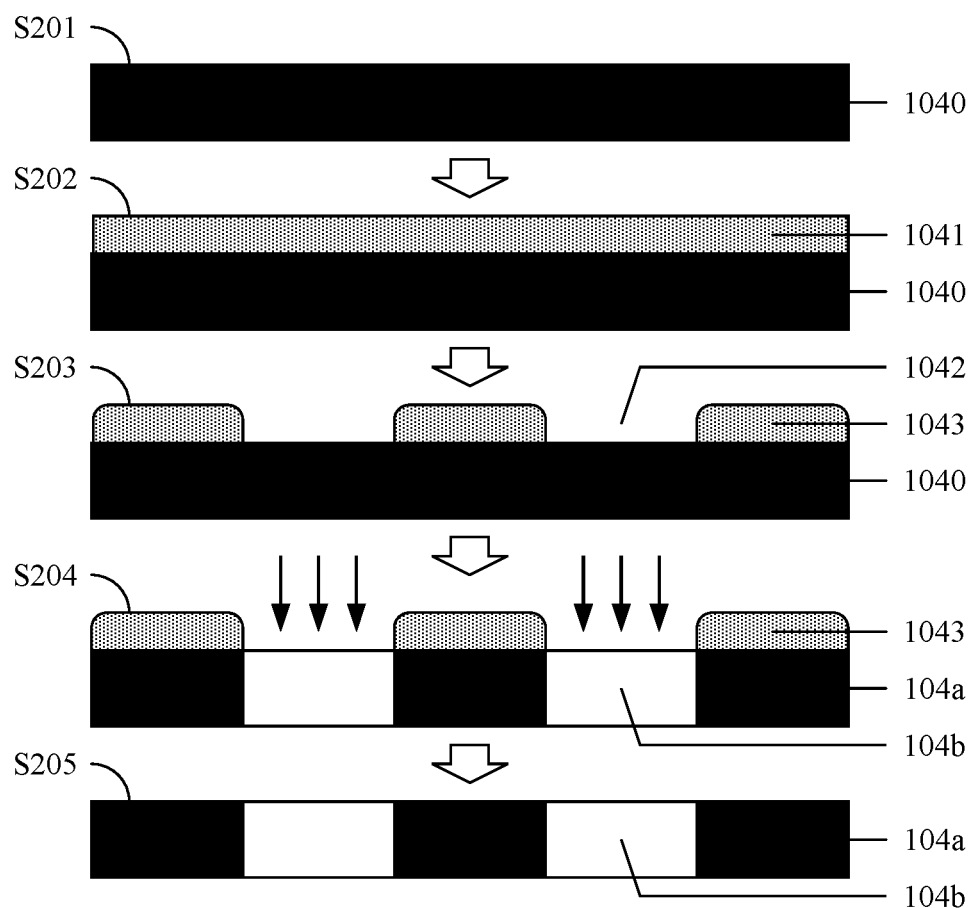
FIG. 4 schematically shows schematic views of a manufacturing process of an auxiliary heat dissipation layer according to at least one embodiment of the present disclosure.

For example, as shown in FIG. 4, forming the auxiliary heat dissipation layer 104 includes the following steps S201-S205.

S201: depositing a light-proof metal film 1040 (for example, a tantalum film) at the light exit side of the organic material functional layer 103.

S202: forming a photoresist 1041 (for example, a positive photoresist) on the metal film 1040.

S203: exposing the photoresist 1041 by using a mask plate and then developing the exposed photoresist to obtain a photoresist-removing portion 1042 and a photoresist-retaining portion 1043, in which, the photoresist-removing portion 1042 corresponds to the metal oxide light transmission portion 104b to be formed, and the photoresist-retaining portion 1043 corresponds to the metal heat dissipation portion 104a to be formed.

S204: oxidizing the first portion, of the metal film 1040, corresponding to the photoresist-removing portion 1042 with an oxidant such as hydrogen peroxide to obtain the metal oxide light transmission portion 104b formed of, for example, a tantalum trioxide film or a tantalum pentoxide film, in which step, the second portion (for example, a tantalum film), of the metal film 1040, corresponding to the photoresist-retaining portion 1043 forms the metal heat dissipation portion 104a.

S205: stripping a residual portion of the photoresist 1041 to obtain the auxiliary heat dissipation layer 104 including the metal heat dissipation portion 104a and the metal oxide light transmission portion 104b.

It should be noted that in the actual production, the metal film 1040 may be not a continuous layer according to the need, as long as a light-shielding layer in a desired region and a light transmission layer in a desired region are formed via the metal film 1040. In addition, a positive photoresist or a negative photoresist is used, which is not limited by the embodiments of the present disclosure.

Based on the above steps S201-S205, the metal heat dissipation portion 104a made of, for example, the tantalum film and the metal oxide light transmission portion 104b made of, for example, the tantalum trioxide film or the tantalum pentoxide film, are formed to obtain the required auxiliary heat dissipation layer 104.

In at least one embodiment of the present disclosure, the manufacturing method of the OLED substrate further includes the following step S3.

S3: forming thin film transistors 105 which are arranged in an array on the base substrate 100.

For example, an orthographic projection of the metal heat dissipation portion 104a on the base substrate 100 covers orthographic projections of the thin film transistors 105 on the base substrate 100. That is, the metal heat dissipation portion 104a shields the regions where the thin film transistors 105 are located.

It should be noted that in the actual production, this step S3 is finished before the above steps S1 and S2.

Taking into consideration that the use of the organic light-emitting material emitting white light has advantages both in terms of cost and process technology maturity, and the organic light-emitting material emitting white light needs to cooperate with a color filter layer to achieve color display, so in at least one embodiment of the present disclosure, the manufacturing method of the OLED substrate further includes the following steps S4.

S4: forming a color filter layer 106 at a side of the auxiliary heat dissipation layer 104 facing away from the organic material functional layer 103.

In this case, the metal heat dissipation portion 104a further corresponds to the position of signal lines between adjacent sub-pixels, to replace a black light-shielding layer, namely the black matrix, and this simplifies the process, reduces the process cost, and improves the production efficiency.

The OLED substrate formed according to the above steps includes the auxiliary heat dissipation layer 104. On one hand, the metal heat dissipation portion 104a utilizes the high thermal conductivity characteristic of metal to promote the heat dissipation of the organic material functional layer 103 during the work process of the organic material functional layer 103, and thereby improves the service life of the organic material functional layer 103. On the other hand, the metal heat dissipation portion 104a has the function of shielding the thin film transistors 105 and the signal lines between adjacent sub-pixels to replace the conventional black light-shielding layer, namely the black matrix, thereby simplifies the process and improves the electrical stability of the thin film transistors 105 and the display quality of the OLED display device; and the metal oxide light transmission portion 104b has a good light transmission performance, does not affect the light emission of the organic material functional layer 103, and has a function of protecting the organic material functional layer 103 to prevent subsequently-formed films from damaging the organic material functional layer 103, and thereby the stability of the OLED device is improved.

Furthermore, the manufacturing method of the OLED substrate further includes: forming a protection layer 107 which is the outermost layer of the OLED substrate. The material of the protection layer 107 is, for example, at least one selected from the group consisting of aluminum oxide ($AlO_x$), silicon oxide ($SiO_x$), silicon nitride ($SiN_x$), silicon nitride oxide (SiON), hafnium oxide ($HfO_x$) or organic insulating material.

The manufacturing methods of the OLED substrates shown in FIG. 1 and FIG. 2 will be described in detail below.

Figure 5:
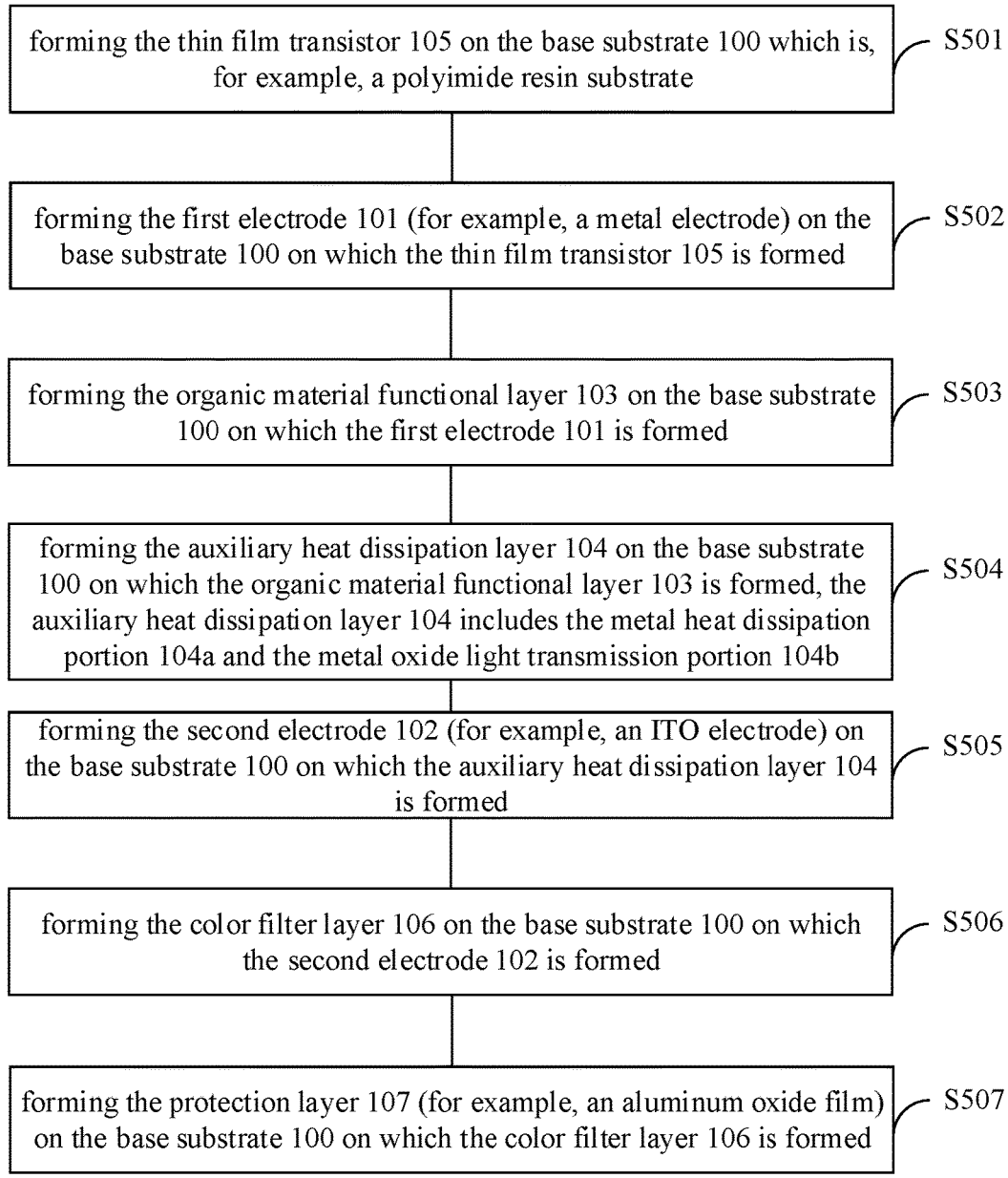
FIG. 5 schematically shows a flow chart of manufacturing steps of the OLED substrate shown in FIG. 1.

In the example shown in FIG. 1, the OLED substrate is used to form the top emission OLED display. Referring to FIG. 5, the manufacturing method of the OLED substrate includes the following steps S501-S507.

S501: forming the thin film transistor 105 on the base substrate 100 which is, for example, a polyimide resin substrate.

S502: forming the first electrode 101 (for example, a metal electrode) on the base substrate 100 on which the thin film transistor 105 is formed.

S503: forming the organic material functional layer 103 on the base substrate 100 on which the first electrode 101 is formed.

S504: forming the auxiliary heat dissipation layer 104 on the base substrate 100 on which the organic material functional layer 103 is formed, in which step, the auxiliary heat dissipation layer 104 includes the metal heat dissipation portion 104a and the metal oxide light transmission portion 104b.

S505: forming the second electrode 102 (for example, an ITO electrode) on the base substrate 100 on which the auxiliary heat dissipation layer 104 is formed.

S506: forming the color filter layer 106 on the base substrate 100 on which the second electrode 102 is formed.

S507: forming the protection layer 107 (for example, an aluminum oxide film) on the base substrate 100 on which the color filter layer 106 is formed.

For example, the metal heat dissipation portion 104a corresponds to the thin film transistor 105 and the positions between adjacent sub-pixels (for example, the positions of respective signal lines), and the metal oxide light transmission portion 104b corresponds to the light exit regions of respective sub-pixels.

Based on the above steps S501-S507, the OLED substrate applied to the top emission OLED display is obtained. On one hand, in the OLED substrate, the heat dissipation of the organic material functional layer 103 is effectively promoted by providing the auxiliary heat dissipation layer 104, and thereby the service life and the display effect of the OLED display are improved; and on the other hand, the metal heat dissipation portion 104a in the auxiliary heat dissipation layer 104 replaces the conventional individually-formed black matrix, and this effectively simplifies the process, thereby increases the production efficiency and reduces the production cost.

Figure 6:
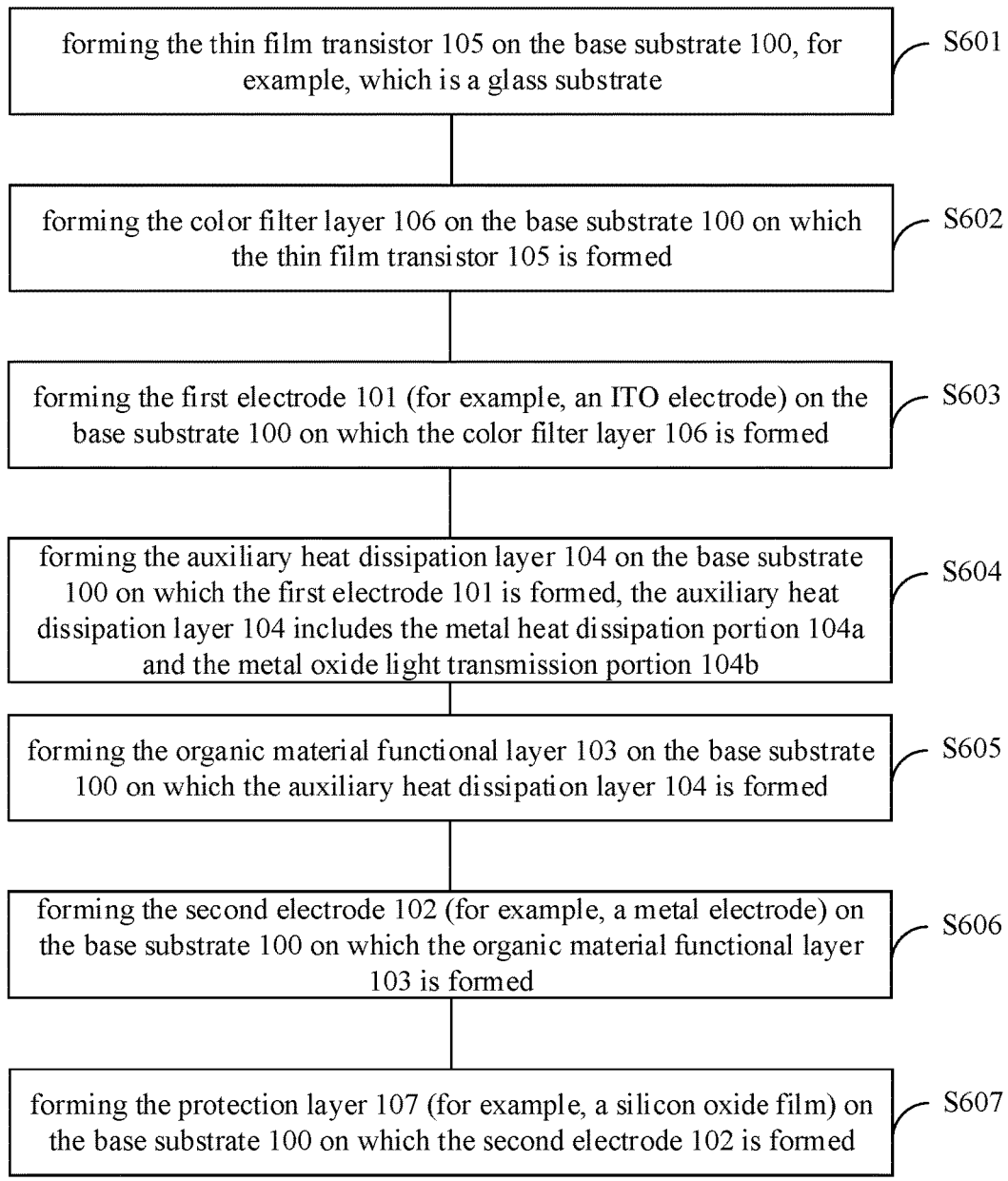
FIG. 6 schematically shows a flow chart of manufacturing steps of the OLED substrate shown in FIG. 2.

In the example shown in FIG. 2, the OLED substrate is used to form the bottom emission OLED display. Referring to FIG. 6, the manufacturing method of the OLED substrate includes the following steps.

S601: forming the thin film transistor 105 on the base substrate 100, for example, a glass substrate.

S602: forming the color filter layer 106 on the base substrate 100 on which the thin film transistor 105 is formed.

S603: forming the first electrode 101 (for example, an ITO electrode) on the base substrate 100 on which the color filter layer 106 is formed.

S604: forming the auxiliary heat dissipation layer 104 on the base substrate 100 on which the first electrode 101 is formed, in which, the auxiliary heat dissipation layer 104 includes the metal heat dissipation portion 104a and the metal oxide light transmission portion 104b.

S605: forming the organic material functional layer 103 on the base substrate 100 on which the auxiliary heat dissipation layer 104 is formed.

S606: forming the second electrode 102 (for example, a metal electrode) on the base substrate 100 on which the organic material functional layer 103 is formed.

S607: forming the protection layer 107 (for example, a silicon oxide film) on the base substrate 100 on which the second electrode 102 is formed.

For example, the metal heat dissipation portion 104a corresponds to the thin film transistor 105 and the positions between adjacent sub-pixels (for example, the positions of respective signal lines), and the metal oxide light transmission portion 104b corresponds to the light exit regions of the respective sub-pixels.

Based on the above steps S601-S607, the OLED substrate applied to the bottom emission OLED display is obtained. On one hand, in the OLED substrate, the heat dissipation of the organic material functional layer 103 is effectively promoted by providing the auxiliary heat dissipation layer 104, and thereby the service life and the display effect of the OLED device are improved; and on the other hand, the metal heat dissipation portion 104a in the auxiliary heat dissipation layer 104 replaces the conventional individually-formed black matrix, and this effectively simplifies the process, thereby increases the production efficiency and reduces the production cost.

Based on the above OLED substrate and the manufacturing method thereof, embodiments of the present disclosure also provide a display device. The display device is formed by sealing the above-mentioned OLED substrate with a glass or a film, and the display device is the top emission OLED display or the bottom emission OLED display.

For example, the display device includes any product or component having a display function such as a mobile phone, a tablet computer, a television, a notebook computer, a digital photo frame, a navigator or the like, which is not specifically limited in the embodiments of the present disclosure.

What are described above is related to the illustrative embodiments of the disclosure only and not limitative to the scope of the disclosure; the scopes of the disclosure are defined by the accompanying claims.

What is claimed is:

1. An OLED (organic light-emitting diode) substrate, comprising:
   a base substrate;
   a first electrode and a second electrode which are on the base substrate;
   an organic material functional layer between the first electrode and the second electrode; and
   an auxiliary heat dissipation layer which is at a light exit side of the organic material functional layer and is in contact with the organic material functional layer,
   wherein the auxiliary heat dissipation layer comprises a metal heat dissipation portion and a metal oxide light transmission portion, the metal heat dissipation portion comprises a metal, the metal oxide light transmission portion comprises a metal oxide, and the metal oxide is an oxide of the metal.

2. The OLED substrate according to claim 1, wherein the metal comprises an elemental metal.

3. The OLED substrate according to claim 1, wherein the metal comprises tantalum and the metal oxide comprises tantalum oxide.

4. The OLED substrate according to claim 1, further comprising a plurality of sub-pixels arranged in an array manner on the base substrate, wherein
   each of the sub-pixels comprises a scan line, a data line, a power source line and a thin film transistor, a gate electrode of the thin film transistor is connected with the scan line, a source electrode of the thin film transistor is connected with the data line, and a drain electrode of the thin film transistor is connected with the power source line and is connected with the first electrode or the second electrode;
   an orthographic projection of the metal heat dissipation portion on the base substrate covers an orthographic projection of the thin film transistor on the base substrate; and
   the orthographic projection of the metal heat dissipation portion on the base substrate further covers orthographic projections of the scan line, the data line and the power source line on the base substrate.

5. The OLED substrate according to claim 4, wherein each of the sub-pixels comprises a light exit region, and an orthographic projection of the metal oxide light transmission portion on the base substrate coincides with an orthographic projection of the light exit region on the base substrate.

6. The OLED substrate according to claim 1, wherein on the base substrate, an upper surface of the metal heat dissipation portion and an upper surface of the metal oxide light transmission portion are in a same plane, and a lower surface of the metal heat dissipation portion and a lower surface of the metal oxide light transmission portion are in a same plane.

7. The OLED substrate according to claim 1, further comprising a color filter layer at a side of the auxiliary heat dissipation layer facing away from the organic material functional layer.

8. A manufacturing method of an OLED substrate, comprising:
- forming a first electrode and a second electrode on a base substrate;
- forming an organic material functional layer between the first electrode and the second electrode; and
- forming an auxiliary heat dissipation layer which is at a light exit side of the organic material functional layer and is in contact with the organic material functional layer,
- wherein the auxiliary heat dissipation layer comprises a metal heat dissipation portion and a metal oxide light transmission portion, the metal heat dissipation portion comprises a metal, the metal oxide light transmission portion comprises a metal oxide, and the metal oxide is an oxide of the metal.

9. The manufacturing method according to claim 8, wherein forming the auxiliary heat dissipation layer comprises:
- forming a metal film by the metal and performing an oxidation treatment on a first portion of the metal film to form the metal oxide light transmission portion, wherein a second portion, which is not subjected to the oxidation treatment, of the metal film forms the metal heat dissipation portion.

10. The manufacturing method according to claim 9, wherein the oxidation treatment is performed using hydrogen peroxide.

11. The manufacturing method according to claim 9, wherein the metal film is formed of an elemental metal.

12. The manufacturing method according to claim 9, wherein the metal film is formed of tantalum.

13. The manufacturing method according to claim 8, wherein
- the OLED substrate comprises a plurality of sub-pixels arranged in an array manner on the base substrate, each of the sub-pixels comprises a scan line, a data line, a power source line and a thin film transistor, a gate electrode of the thin film transistor is connected with the scan line, a source electrode of the thin film transistor is connected with the data line, and a drain electrode of the thin film transistor is connected with the power source line and is connected with the first electrode or the second electrode;
- an orthographic projection of the metal heat dissipation portion on the base substrate covers an orthographic projection of the thin film transistor on the base substrate; and
- the orthographic projection of the metal heat dissipation portion on the base substrate further covers orthographic projections of the scan line, the data line and the power source line on the base substrate.

14. The manufacturing method according to claim 13, wherein each of the sub-pixels comprises a light exit region, and an orthographic projection of the metal oxide light transmission portion on the base substrate coincides with an orthographic projection of the light exit region on the base substrate.

15. The manufacturing method according to claim 8, wherein on the base substrate, an upper surface of the metal heat dissipation portion and an upper surface of the metal oxide light transmission portion are in a same plane, and a lower surface of the metal heat dissipation portion and a lower surface of the metal oxide light transmission portion are in a same plane.

16. The manufacturing method according to claim 8, further comprising:
- forming a color filter layer at a side of the auxiliary heat dissipation layer facing away from the organic material functional layer.

17. A display device, comprising the OLED substrate according to claim 1.

18. An OLED (organic light-emitting diode) substrate, comprising:
- a base substrate;
- a first electrode and a second electrode which are on the base substrate;
- an organic material functional layer between the first electrode and the second electrode; and
- an auxiliary heat dissipation layer which is at a light exit side of the organic material functional layer and is in contact with the organic material functional layer,
- wherein the auxiliary heat dissipation layer comprises a metal heat dissipation portion and a metal oxide light transmission portion, and
- wherein on the base substrate, an upper surface of the metal heat dissipation portion and an upper surface of the metal oxide light transmission portion are in a same plane, and a lower surface of the metal heat dissipation portion and a lower surface of the metal oxide light transmission portion are in a same plane.

* * * * *